(12) United States Patent
Chen et al.

(10) Patent No.: US 7,332,905 B2
(45) Date of Patent: Feb. 19, 2008

(54) FIXTURE FOR CIRCUIT BOARD

(75) Inventors: Ken Chen, Taipei (TW); Chiy-Ray Shiue, Taipei (TW)

(73) Assignee: Inventec Corporation, Shih-Lin District, Taipei (TW)

( * ) Notice: Subject to any disclaimer, the term of this patent is extended or adjusted under 35 U.S.C. 154(b) by 120 days.

(21) Appl. No.: 11/394,429

(22) Filed: Mar. 31, 2006

(65) Prior Publication Data
US 2007/0132444 A1    Jun. 14, 2007

(30) Foreign Application Priority Data
Dec. 13, 2005    (TW)    ............................... 94221697 U

(51) Int. Cl.
*G01R 31/02*    (2006.01)

(52) U.S. Cl. .................................... 324/158.1; 324/755
(58) Field of Classification Search .................... None
See application file for complete search history.

(56) References Cited

U.S. PATENT DOCUMENTS 1,864,840 A * 6/1932 Lehner ....................... 144/287
6,437,557 B1 * 8/2002 Smith ....................... 324/158.1
6,667,630 B2 * 12/2003 Abdulky ..................... 324/755

\* cited by examiner

*Primary Examiner*—Minh N. Tang
(74) *Attorney, Agent, or Firm*—Fulbright & Jaworski

(57) ABSTRACT

A fixture for clamping and fixing a circuit board is provided. The fixture includes a base and a moving element. The base includes a first supporting board and a second supporting board disposed on the first supporting board. At least one positioning bump is disposed on the second supporting board, and at least one hole is formed on a side of the first supporting board. The moving element includes at least one guide rod which passes through the hole of the base, such that a clamping space is formed between the moving element and the base. Circuit boards with different dimensions can be fixed in place by adjusting the width of the clamping space. Furthermore, a plate element is disposed on the second supporting board and thereby fixed to the circuit board. The clamping space is adjusted by the moving element and thereby made larger and more flexible, thus the clamping space is suitable for circuit boards of different styles and dimensions.

5 Claims, 3 Drawing Sheets

FIXTURE FOR CIRCUIT BOARD

BACKGROUND OF THE INVENTION

1. Field of the Invention

The present invention relates to a fixture for a circuit board, and more particularly, to a fixture for clamping and fixing the circuit board in place.

2. Description of Related Art

A plurality of expandable interface cards, such as Small Computer System Interface (SCSI), Peripheral Component Interface (PCI), Accelerated Graphics Port (AGP) and so on, are used in computer. In this regard, an interface card is a circuit board having a plurality of electronic components for connection with peripheral devices of the computer. However, a metal plate must be fixed on the interface card so as to lock the plate on a casing of the computer while plugging the interface card to an expanded slot of a main board.

FIG. 1 is a three-dimensional view showing a fixture 13 for fixing a plate element 11 on a circuit board 12 in the prior art. The fixture 13 comprises a first supporting board 131 for supporting the circuit board 12, and a second supporting board 132 for supporting the plate element 11, wherein a clamping space 133 with a fixed size is formed between the second supporting board 132 and the first supporting board 131, and at least one positioning bump 132a is disposed on the second supporting board 132. The circuit board 12 lies on the first supporting board 131 in the clamping space 133, such that the circuit board 12 is positioned in the clamping space 133 of the fixture 13. The plate element 11 has at least one opening 11a corresponding to the positioning bump 132a of the second supporting board 132. The opening 11a positions the plate element 11 on the second supporting board 132. The plate element 11 further comprises at least one fixing hole 11b. The circuit board 12 comprises at least one positioning hole 12a corresponding to the fixing hole 11b, such that a screw 14 is passed through the fixing hole 11b and screwed into the positioning hole 12a so as to fix the plate element 11 to the circuit board 12.

However, the width w of the clamping space 133 is based on fixed dimensions and therefore invariable, that is to say, the width of the first supporting board 131 is designed according to the width of the circuit board (i.e. interface card), thus a fixture of certain dimensions is dedicated to a certain type of interface cards. As there are a wide variety of interface cards which differ from each other in dimensions, the drawbacks of manufacturing a fixture for use with circuit boards of certain dimensions are as follows:

First, different types of interface cards mean different widths of the circuit board 12; since the width w of the first supporting board 131 is designed according to the width of the circuit board 12, the fixture cannot be applied to other circuit boards having dimensions other than the above-mentioned. In other words, one type of fixtures is only applicable to one type of interface cards. A new fixture must be manufactured in response to the advent of a new interface card, which requires enormous manpower, material and money and therefore increases manufacturing costs.

Second, as science and technology evolve, the types of interface cards are ever-increasing, so are the types of fixtures. Thus more and more space is required to store fixtures. Besides, storage and classified management of a wide variety of fixtures are never easy.

Accordingly, the problem to be solved here is to provide a fixture characterized by flexible use, short manufacturing time, a low manufacturing cost, a high space utilization rate, and ease of storage and management.

SUMMARY OF THE INVENTION

In light of the above-mentioned drawbacks of the prior art, it is a primary objective of the present invention to provide a fixture for use with a circuit board, such that the fixture is flexible to use, applicable to different types of circuit boards on which a plate element is installed.

It is another objective of the present invention to provide a fixture for circuit boards with different dimensions, to avoid manufacturing a new fixture to replace the old one.

It is a further objective of the present invention to provide a fixture for a circuit board such that the fixture has a high space utilization rate and is easy to store and manage.

In order to achieve the above-mentioned and other objectives, a fixture for a circuit board is provided in the present invention. The fixture comprises a base and a moving element. The base comprises a first supporting board and a second supporting board disposed on the first supporting board. At least one positioning bump is disposed on the second supporting board, whereas at least one hole is disposed on a side of the first supporting board. The moving element comprises at least one guide rod which passes through the hole of the base, such that a clamping space is formed between the moving element and the base.

In a preferred embodiment, a fastener, such as a bolt, is disposed beside the hole of the first supporting board, and the fastener presses the guide rod and thereby fixes the moving element in place. The position of the moving element and then the width of the clamping space is adjusted, by loosening the fastener, to fasten circuit boards with different dimensions in place.

Unlike the prior art, the present invention provides a fixture for a circuit board, such that the fixture can be flexibly adjusted according to the specifications of the circuit board, so the fixture is characterized by a relatively high degree of flexible use and is fit to fix a plate element on different types of circuit boards. Despite the emergence of a new type of circuit boards, it is not necessary to manufacture the fixture anew instead, the only thing left to do is to adjust the width of the clamping space such that it equals the width of the new circuit board, thus the fixture has the advantages of short manufacturing time and low manufacturing costs. In addition, not only is an optimal space utilization rate attained when no additional storage space is required to store the new fixtures which may otherwise appear, but a great reduction in the number of types of fixtures facilitates the storage and management of the fixtures.

BRIEF DESCRIPTIONS OF THE DRAWINGS

DETAILED DESCRIPTIONS OF PREFERRED EMBODIMENTS

The following illustrative embodiments are provided to illustrate the disclosure of the present invention. These and other advantages and effects can be easily understood by those skilled in the art after reading the disclosure of this specification. The present invention can also be performed or applied by other different embodiments. The details of the specification can be modified or changed on the basis of different points and applications yet still within the scope of the present invention.

Figure 1:
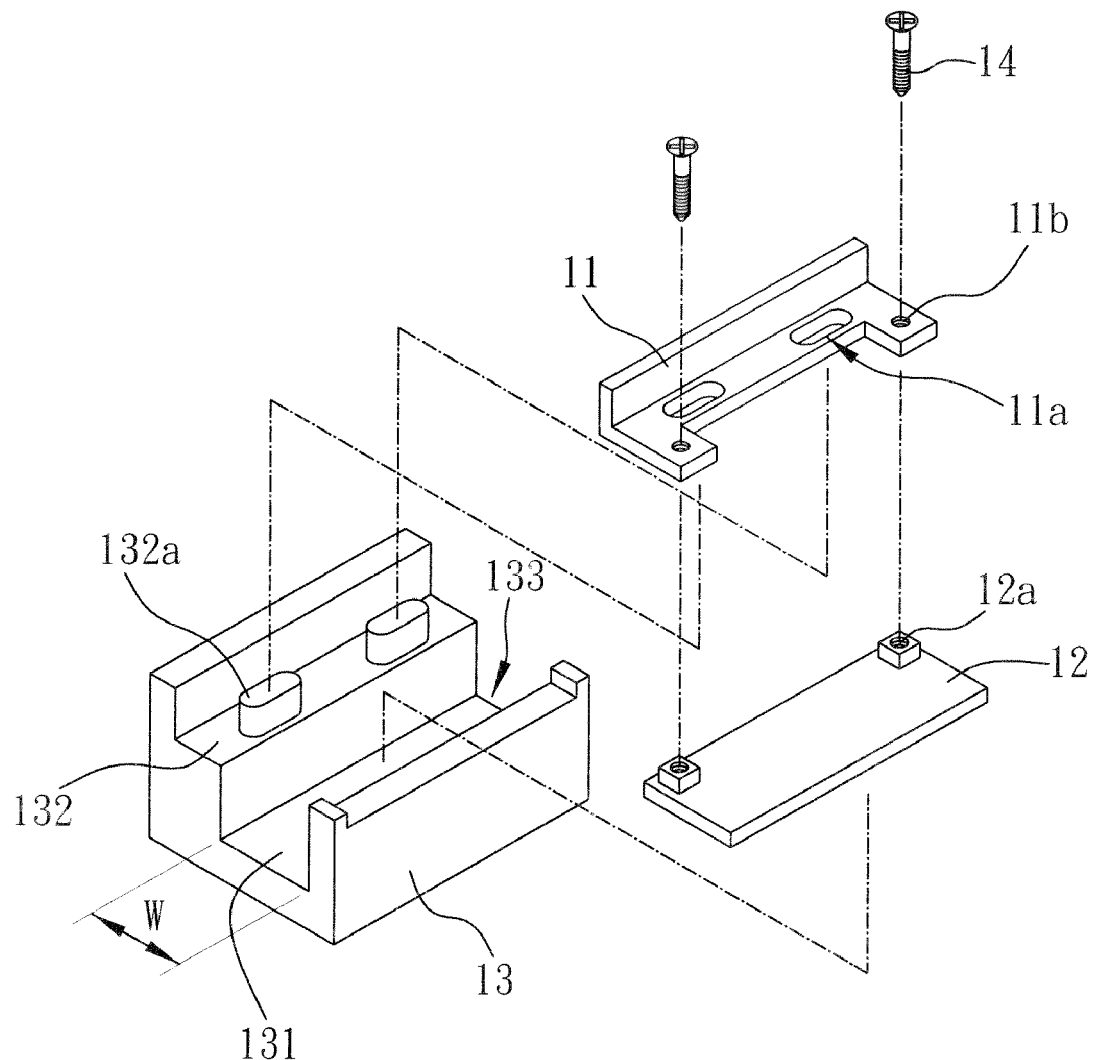
FIG. 1 is an exploded three-dimensional view showing a conventional fixture for fixing a plate element on a circuit board.
Figure 2A:
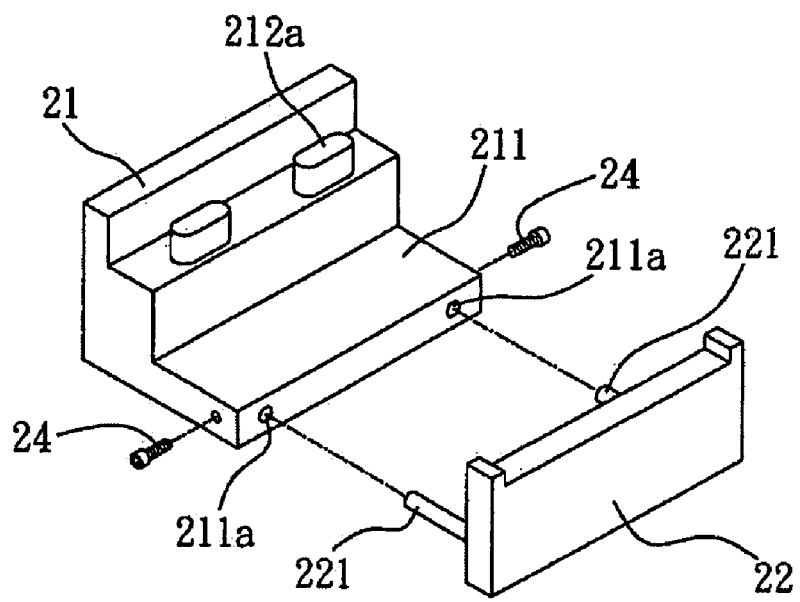
FIG. 2A is an exploded three-dimensional view showing a fixture for a circuit board of the present invention.
Figure 2B:
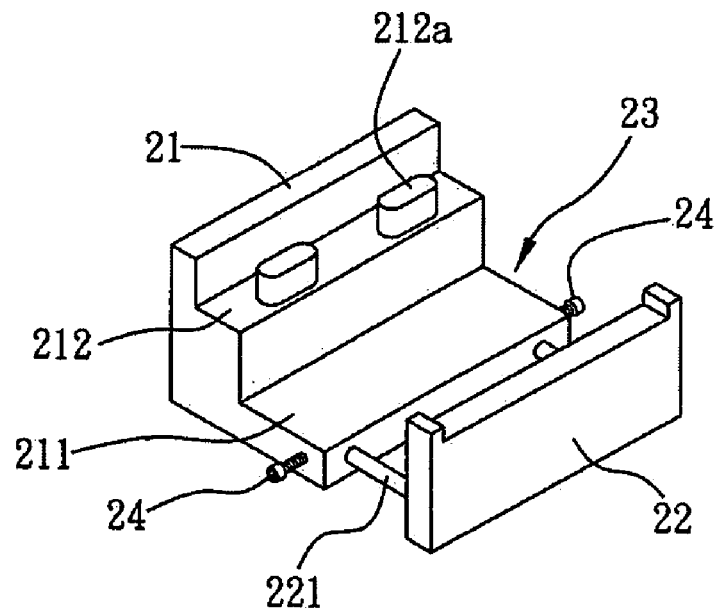
FIG. 2B is a three-dimensional view showing a fixture for a circuit board of the present invention.

FIGS. 2A and 2B are an exploded three-dimensional diagram and a three-dimensional diagram respectively, which show a fixture for clamping and fixing a plate element on a circuit board, such as an interface card, according to the present invention. A fixture 2 of the present invention comprises a base 21 and a moving element 22. The base 21 comprise a first supporting board 211 and a second supporting board 212 disposed the first supporting board 211, wherein at least one positioning bump 212a is disposed on the second supporting board 212, and at least one hole 211a is disposed on a side of the first supporting board 211. The moving element 22 comprises at least one guide rod 221 which passes through the hole 211a of the base 21, such that a clamping space 23 is formed between the moving element 22 and the base 21. Furthermore, a fastener 24 such as a bolt is disposed beside the hole 211a of the first support board 211 so as to press the guide rod 221, thus fixing the moving element 22 in place.

Figure 3A:
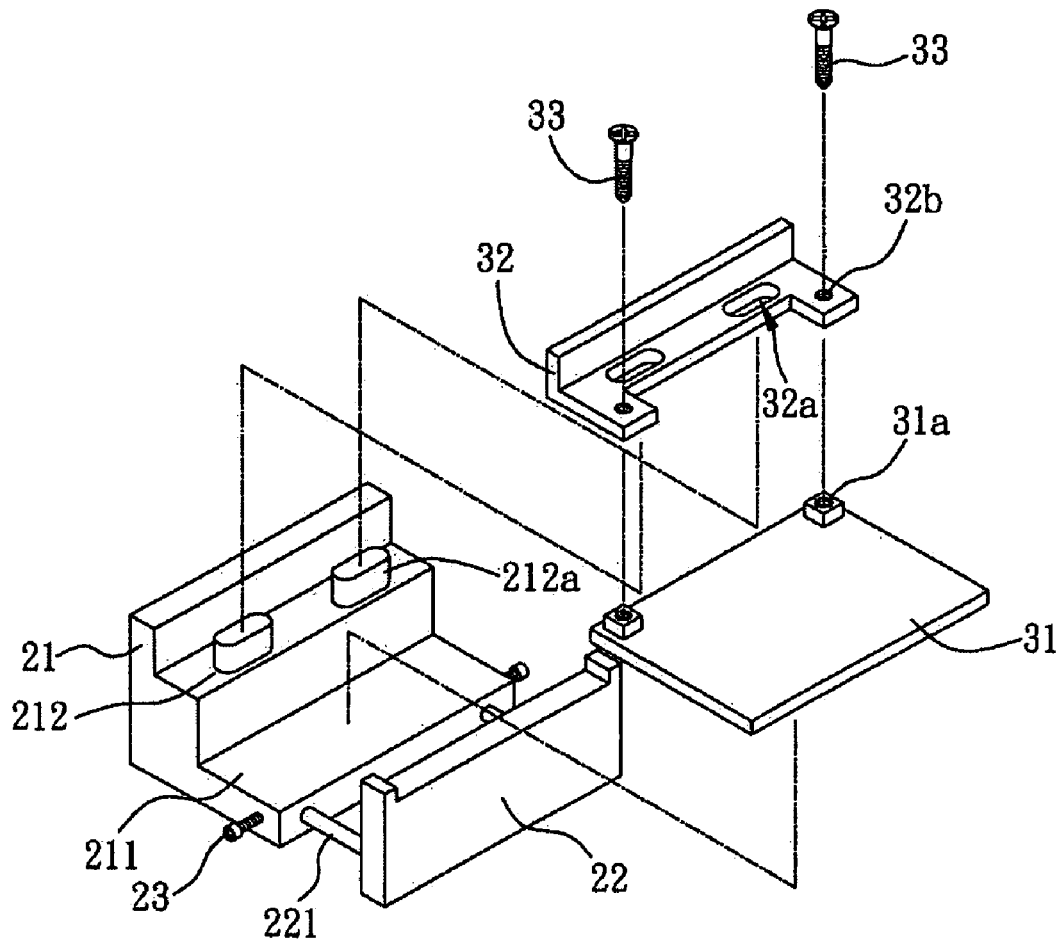
FIG. 3A is an exploded three-dimensional view showing a fixture for fixing a plate element on a circuit board according to the present invention.
Figure 3B:
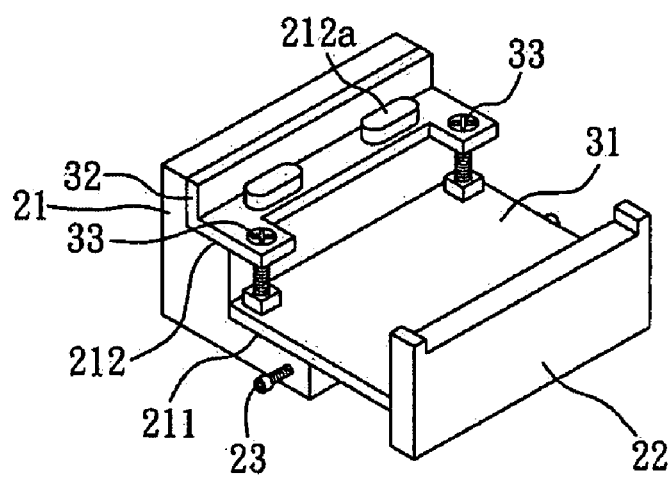
FIG. 3B is a three-dimensional view showing a fixture for fixing a plate element on a circuit board according to the present invention.

Referring to FIGS. 3A and 3B, a circuit board 31 having a plurality of positioning holes 31a is placed in the clamping space 23, and the moving element 22 is moved to adjust the width of the clamping space 23 by loosening the fastener 24 disposed on a side of the first supporting board 211, such that the clamping space 23 can hold circuit boards 31 with different dimensions.

Furthermore, a plate element 32 is positioned on the second supporting board 212 because the positioning bump 212a of the second supporting board 212 penetrates opening 32a, wherein the opening 32a is disposed on the plate element 32 and corresponds to the positioning bump 212a. The plate element 32 further comprises a plurality of fixing holes 32b, each of which juxtaposes the positioning hole 31a of the circuit board 31 by the positioning bump 212a of the second supporting board 212, such that a fastener 33, for example, a screw, passes through the fixing hole 32b and fixes the plate element 32 to the circuit board 31.

The amount and position of the plurality of positioning holes 31a of the circuit board 31 and the plurality of fixing holes 32b of the plate element 32 are not limited by the descriptions and drawings mentioned above but can be varied as desired.

As a result, the fixture for a circuit board of the present invention comprises a base and a moving element, wherein a guide rod of the moving element passes through a hole of the base, and a fastener with a positioning function is provided. The position of the guide rod is adjusted according to the width of the circuit board, such that the width of the clamping space is adjusted to meet the need for circuit boards with different dimensions. Therefore, characterized by flexible variation of space and flexible use, the fixture is fit to fix a plate element to circuit boards of different widths.

As the fixture for a circuit board of the present invention is used in fixing a plate element on different types of circuit boards, once a new type of circuit boards is designed, it will not be necessary to manufacture a new matching fixture in accordance with the width of the new type of circuit boards needs to be remanufactured, thus shortening the manufacturing time and reducing the manufacturing costs. In addition, not only is an optimal space utilization rate attained when no additional storage space is required to store the new fixtures which may otherwise appear, but a great reduction in the number of types of fixtures facilitates the storage and management of the fixtures and thereby makes the fixtures usable to a greater extent.

The foregoing embodiments are only illustrated to disclose the features and functions of the present invention but are not intended to restrict the scope of the present invention. It should be apparent to those skilled in the art that all equivalent modifications and variations made according to the spirit and principle in the disclosure of the present invention should fall within the scope of the appended claims.

What is claimed:

1. A fixture for clamping and fixing a circuit board in place, the fixture comprising:
   a base comprising a first supporting board, and a second supporting board disposed on the first supporting board, the second supporting board being provided with at least one positioning bump, and a side of the first supporting board being provided with at least one hole;
   a plate element engaged with the positioning bump of the second supporting board, wherein the plate element comprises a plurality of fixing holes through which at least one fastener passes so as to fix the plate element to the circuit board; and
   a moving element comprising at least one guide rod, wherein the guide rod passes through the hole in the first supporting board to enable formation of a clamping space between the moving element and the base.

2. The fixture of claim 1, further comprising a fastener disposed beside the hole of the first supporting board and configured to press the guide rod of the moving element, so as to fix the moving element in place.

3. The fixture of claim 2, wherein the fastener is a bolt.

4. The fixture of claim 1, wherein the plate element comprises an opening corresponding to the positioning bump.

5. The fixture of claim 1, wherein the fastener is a screw.

* * * * *